United States Patent [19]
Dailey et al.

[11] Patent Number: 5,365,166
[45] Date of Patent: Nov. 15, 1994

[54] SYSTEM AND METHOD FOR TESTING ELECTRICAL GENERATORS

[75] Inventors: George F. Dailey, Plum Borough; James A. Bauer, Gibsonia; Mark W. Fischer, Pittsburgh, all of Pa.

[73] Assignee: Westinghouse Electric Corporation, Pittsburgh, Pa.

[21] Appl. No.: 15,963

[22] Filed: Feb. 8, 1993

[51] Int. Cl.$^5$ ............................................. G01R 31/34
[52] U.S. Cl. ............................. 324/158 MG; 324/545
[58] Field of Search ............... 324/158 MG, 545, 546; 340/648; 322/99; 73/12.09, 865.8; 348/82, 84

[56] References Cited

U.S. PATENT DOCUMENTS

| 4,272,781 | 6/1981 | Tagucai et al. | 348/82 |
| 4,658,928 | 4/1987 | Seo | 180/168 |
| 4,803,563 | 2/1989 | Dailey et al. | 324/220 |
| 4,889,000 | 12/1989 | Jaafar et al. | 73/865.8 |
| 4,962,660 | 10/1990 | Dailey et al. | 73/12.09 |
| 4,970,890 | 11/1990 | Jaafar et al. | 73/12.09 |
| 4,996,486 | 2/1991 | Posedel | 324/545 |
| 5,012,684 | 5/1991 | Humphries | 73/865.8 |
| 5,020,234 | 6/1991 | Alkire et al. | 73/865.8 |

Primary Examiner—Ernest F. Karlsen

[57] ABSTRACT

A system and method for testing an electrical generator of the type having a rotor (14) and a stator (12) includes or utilizes a movable carriage (22) having testing equipment which is sized to fit between the rotor (14) and stator (12) and is positionable over a selected stator (12) slot so as to be able to axially traverse the selected stator (12) slot, at least one sensor for sensing whether the movable carriage (22) is centered in an optimum position with respect to the selected stator (12) slot; and structure for centering the movable carriage (22) with respect to the optimum position if the sensor indicates the movable carriage (22) is not so centered, whereby accuracy of any testing by the testing equipment is optimized.

8 Claims, 3 Drawing Sheets

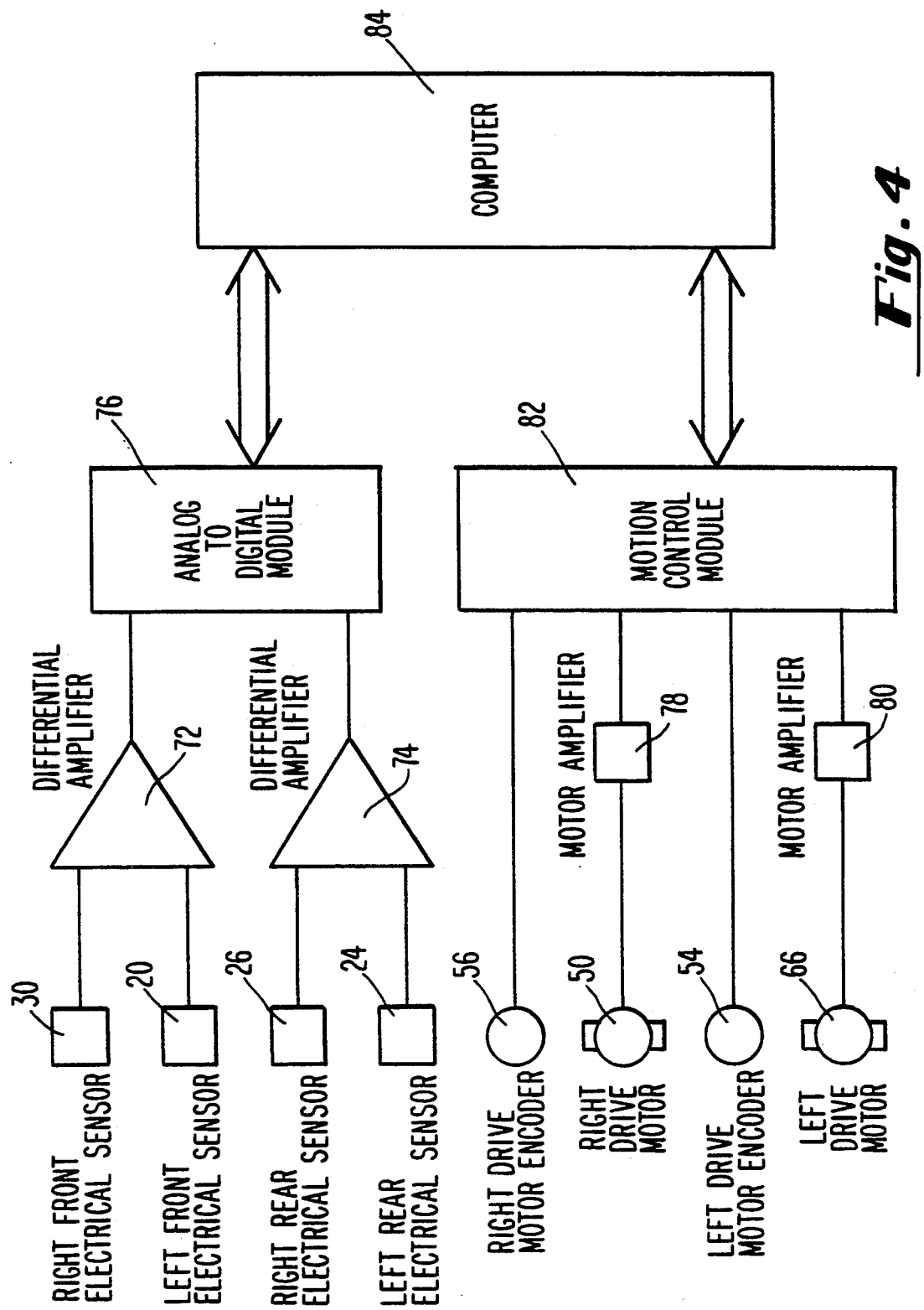

SYSTEM AND METHOD FOR TESTING ELECTRICAL GENERATORS

BACKGROUND OF THE INVENTION

1. Field of the Invention

This invention broadly relates to systems and processes for testing electrodynamic equipment such as electrical generators. More specifically, this invention relates to an improved carriage for performing such testing.

2. Description of the Prior Art

Westinghouse Electric Corporation, the assignee of this invention, has developed several remotely controlled carriages that will go into the air gap of an electrical generator to perform various inspections. Such inspections may include visual examinations of the generator stator and rotor, testing for electrical shorts in the stator core laminations, and testing the tightness of stator wedges in the stator slot. Such carriages are disclosed in U.S. Pat. Nos. 4,803,563, 4,962,660, 4,970,890, and 5,020,234.

Such inspection carriages are typically held against the stator iron by use of permanent magnets which are provided on the carriages. In many electrical generator designs, a gap is provided between the stator wedges and the stator iron, and this enables the carriages to be guided along the stator slots by use of thin guides that ride in the stator slot, which keeps the carriages from straying into another stator slot. However, some generator designs do not include such a gap. In those generators, it is difficult to accurately guide an inspection carriage along a stator slot which is to be inspected. If an inspection carriage becomes misaligned with respect to the stator slot, testing accuracy is often compromised.

In addition, inspection carriages typically are connected to a control unit by a control cable. In some situations, the weight of the control cable or other forces transmitted by the cable can interfere with movement of the carriage along the stator slot which is to be tested.

It is clear that there has existed a long and unfilled need in the prior art for a remotely controlled electrical generator testing carriage which can accurately traverse a stator slot without the use of a mechanical guide, and which is insulated from forces which are transmitted through the control cable.

SUMMARY OF THE INVENTION

Accordingly, it is a first object to the invention to provide a remotely controlled carriage for inspecting an electrical generator which can accurately traverse a stator slot which is to be inspected without the use of a mechanical guide.

It is further an object of the invention to provide a remotely controlled carriage for inspecting an electrical generator which is insulated from forces that might otherwise be transmitted to the carriage through a control cable.

In order to achieve the above and other objects of the invention, a system according to a first aspect of the invention for performing a test on an electrical generator of the type having a rotor and a stator, the stator having an inner periphery defining a space within which the rotor is mounted to rotate, the inner periphery comprising a magnetic material in which a plurality of axial stator slots are defined, includes a moveable carriage which is sized to fit between the rotor and stator and is positionable over a selected stator slot so as to be able to axially traverse the selected stator slot, said carriage being adapted to have testing equipment mounted thereon; sensing structure for sensing whether the moveable carriage is centered in an optimum position with respect to the selected stator slot; and centering structure for centering the moveable carriage with respect to the optimum position if the sensing structure indicates that the moveable carriage is not so centered, whereby accuracy of any testing by the testing equipment is optimized.

According to a second aspect of the invention, a system for performing a test on such an electrical generator includes a moveable carriage which is sized to fit between the rotor and stator and is positionable over a selected stator slot so as to be able to axially traverse the selected stator slot, the carriage being adapted to have testing equipment mounted thereon; and centering structure for centering the moveable carriage with respect to an optimum position over the slot, the centering structure not comprising a mechanical guide.

According to a third aspect of the invention, a method for performing a test on such an electrical generator includes steps of (a) positioning a moveable carriage over a selected stator slot so as to be able to axially traverse the selected stator slot, the carriage having testing equipment mounted thereon; (b) performing a test with the testing equipment; (c) sensing whether the moveable carriage is centered in an optimum position with respect to the selected stator slot; and (d) centering the moveable carriage with respect to the optimum position if the moveable carriage is not so centered, whereby accuracy of any testing by the testing equipment is optimized.

A system according to a fourth aspect of the invention for performing a test on such an electrical generator includes a moveable carriage which is sized to fit between the rotor and stator and is positionable over a selected stator slot so as to be able to axially traverse the selected stator slot, the carriage being adapted to have testing equipment mounted thereon, the moveable carriage further having a cable connected thereto; and cable supporting structure adjacent to the moveable carriage for supporting the cable, whereby the moveable carriage is protected against forces that might otherwise be transmitted to the moveable carriage through the cable.

These and various other advantages and features of novelty which characterize the invention are pointed out with particularity in the claims annexed hereto and forming a part hereof. However, for a better understanding of the invention, its advantages, and the objects obtained by its use, reference should be made to the drawings which form a further part hereof, and to the accompanying descriptive matter, in which there is illustrated and described a preferred embodiment of the invention.

BRIEF DESCRIPTION OF THE DRAWINGS

FIG. 4 is a schematic diagram depicting a control system for the carriage illustrated in FIGS. 1–3;

DETAILED DESCRIPTION OF THE PREFERRED EMBODIMENTS

Figure 1:
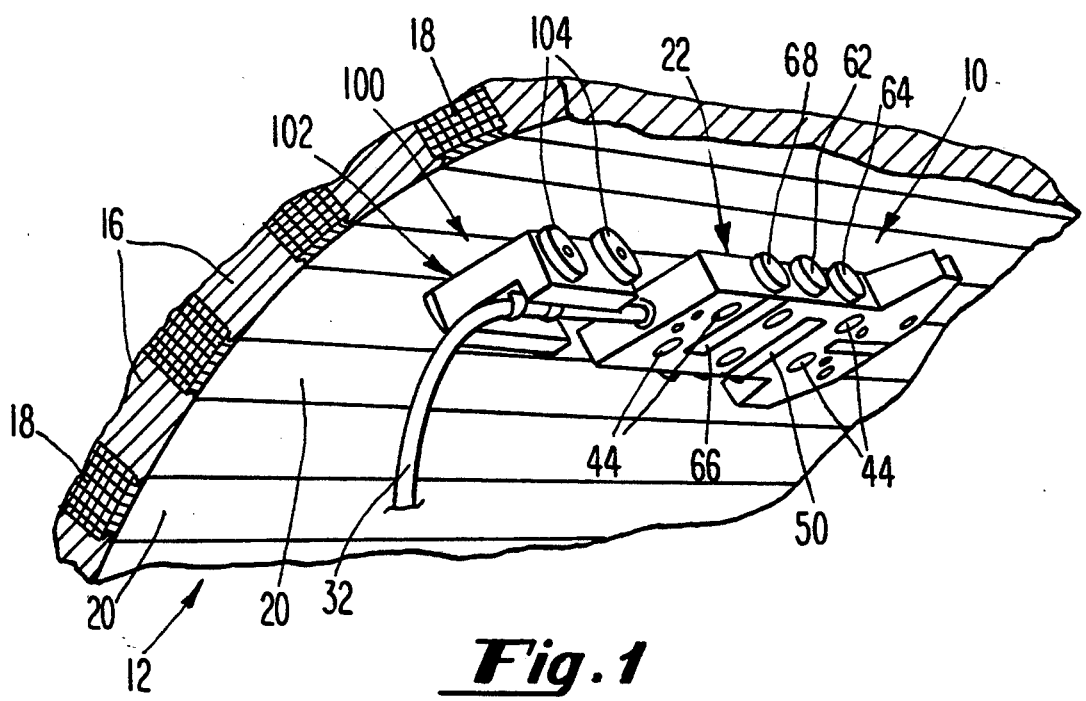
FIG. 1 is a perspective view of an improved generator testing system according to a preferred embodiment of the invention.
Figure 2:
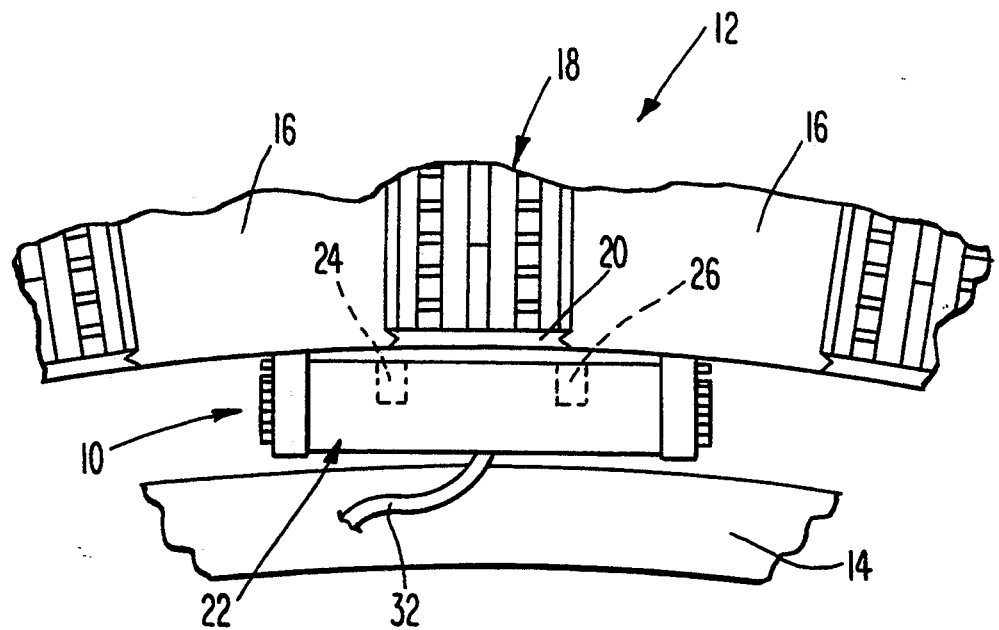
FIG. 2 is a fragmentary diagrammatical view depicting positioning of an inspection carriage according to the invention.
Figure 3:
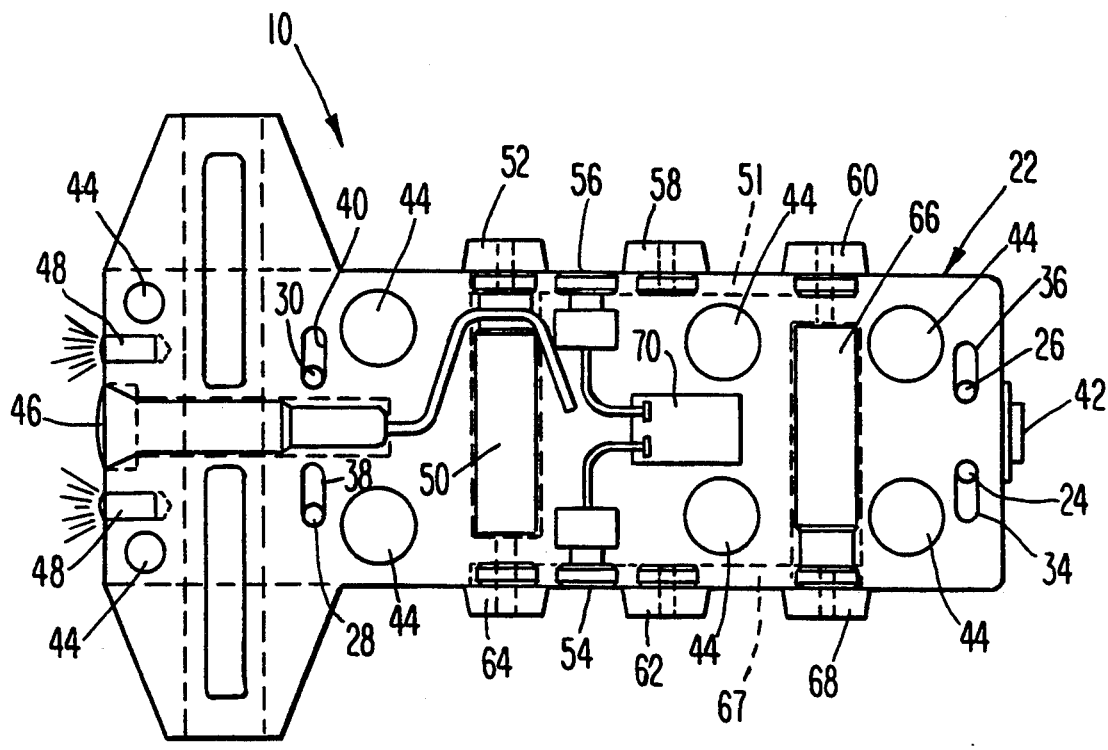
FIG. 3 is a top plan diagrammatical view depicting a carriage which is illustrated in FIG. 2.

Referring now to the drawings, wherein like reference numerals designate corresponding structure throughout the views, and referring in particular to FIGS. 1–3, a system 10 for testing an electrical generator according to a preferred embodiment of the invention is shown juxtaposed to an electrical generator of the type which includes a stator 12 and a rotor 14. As is typical with such generators, stator 12 has an inner periphery in which radial slots are defined in stator iron 16. A stator coil 18 is provided in each of the slots which are defined in stator iron 16. Stator coil 18 is retained in such slots by a nonmagnetic stator wedge 20, as is best shown in FIG. 2.

Referring again to FIG. 2, testing system 10 includes a carriage 22 which is sized to fit within the air gap which is defined between stator 12 and rotor 14. As may be seen in FIGS. 2 and 3, carriage 22 has a plurality of electrical sensors mounted thereon for sensing whether the carriage 22 is centered in an optimum position with respect to the stator slot in which stator coil 18 is positioned. Specifically, such sensors include a left rear sensor 24 which is adjustably positioned within a slot 34, a right rear electrical sensor 26 which is, similarly adjustably positioned within a slot 36, a forward left sensor 28 which is adjustably positioned in slot 38 and a forward right electrical sensor 30 which is adjustably positioned with a slot 40. Adjustability slots 34, 36, 38, and 40 are provided to permit carriage 22 to be used to inspect generators which have different slot widths.

Referring to FIGS. 2 and 3, it will be seen that carriage 22 is remotely controlled via a control cable 32, which is connected to carriage 22 via an electrical signal connection 42. Carriage 22 further has a plurality of magnets 44 mounted thereon. Magnets 44 are spaced sufficiently apart so as to be positioned adjacent to the stator iron 16 on both sides of a coil 18, as viewed in FIG. 2. As a result, magnets 44 secure carriage 22 in a position adjacent to stator coil 18 so that wheels 52, 58, 60, 62, 64 and 68 are pulled into contact with the surface of the respective stator iron portions 16.

A color CCD camera 46 is also positioned on carriage 22 to perform visual inspections on both the generator stator 12 and generator rotor body. The color CCD camera 46 also aids in positioning the carriage 22 to a desired location which is extremely important when performing testing of the tightness of the stator wedges 20. A pair of lights 48 are provided on the forward end of carriage 22 to provide the necessary lighting for the color CCD camera 46.

Carriage 22 further includes a first drive motor 50 which is, through a drive train 51, connected to drive three right side wheels 52, 58, and 60. Similarly, a second drive motor 66 drives three left side wheels 68, 62, 64 via a drive train 67. Drive trains 51, 57 are such that each set of drive wheels 52, 58, 60 or 62, 64, 68 rotate at equal angular velocities.

Figure 5:
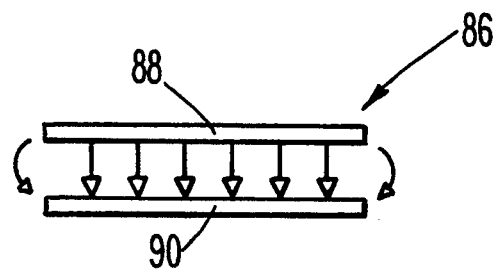
FIG. 5 is a diagrammatical depiction of an electrical sensor on the carriage illustrated in FIGS. 1–4 according to a first embodiment.
Figure 6:
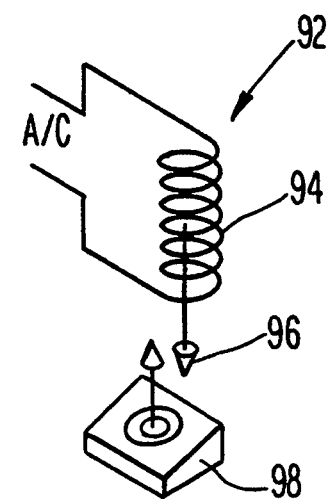
FIG. 6 is a diagrammatical depiction of an electrical sensor according to a second embodiment.

The main goal of the electrical sensors 24, 26, 28, 30 is to detect the electrical conductivity difference between the generator stator iron 16 and the non-conductive, nonmagnetic stator wedges 20. There is a large electrical conductivity difference between the stator iron 16, which usual is fabricated of electrical grade steel and the stator wedges 20, which are fabricated from fiberglass. There are two types of electrical sensors that are suited in detecting electrical conductivity differences. Referring briefly to FIG. 5, a first embodiment of the invention is depicted where sensors 24, 26, 28, 30 are embodied as capacitive sensing units 86. Each capacitive sensing unit 86 includes a capacitive sensor 88 which is positioned over the underlying material 90. A second embodiment of the invention, depicted in FIG. 6, alternatively utilizes inductive sensors 92, each of which include an inductive coil 94 which generates a magnetic field 96 over the underlying material 98.

Looking now to FIG. 4, the two forward electrical sensors 28, 30 are connected to a differential amplifier 72, and the two rear electrical sensors 24, 26 are likewise connected to a second differential amplifier 74. Differential amplifiers 72, 74 are in communication with an analog to digital module 76, which is in two way communication with a computer 84. Computer 84 is also in two way communication with a motion control module 82. Motion control module 82 receives input from left and right drive motor encoders 54, 56, respectively. Motion control module 82 further provides signal instructions, amplified by amplifiers 78, 80 to right and left drive motors 50, 66, respectively.

In operation, carriage 22 is positioned in the air gap between rotor 14 and stator 12 such that electrical sensors 24, 26, 28, 30 are initially aligned so that half of each sensor is positioned over the generator stator iron 16 and the other half of the sensor is positioned over the stator wedge 20. If the carriage 22 moves from the center of the stator slot, then the conductivity of the material that is directly under the respective electrical sensors 22, 24, 26, 28 will change. Signals from the right front electrical sensor 30 and left front electrical sensor 28 are sent to differential amplifier 72, which compares the two signals and outputs the difference between them. The output of the differential amplifier 72 is sent to the analog to digital module 76, and from there to the computer 84. Similarly, signals from the left and right rear electrical sensors 24, 26, are sent to differential amplifier 74, which compares the two signals and outputs the difference between them to analog to digital module 76. This information is also passed on to computer 84. Computer 84 uses the information from differential amplifier 72 to determine if the front of the carriage 22 is to the right or left of the center of the stator slot. Similarly, computer 84 uses the information from differential amplifier 74 to determine whether the rear of the carriage 22 is to the left or right of the center of the stator slot.

When either the front or rear of the carriage 22 is to the right or left of the center of the stator slot, the computer 84 sends a signal to the motion control module 82 to compensate for the misalignment. The motion control module 82 monitors how fast the drive motors 50, 66 are moving because it receives such information from the respective encoders 56, 54. Motion control module 82 also controls movement of the left and right drive motor 66, 50 by sending out signals which are amplified by the respective amplifiers 80, 78. Using this feed back control loop, computer 84 can adjust for any misalignment detected by the electrical sensors 24, 26, 28, 30 by varying the speed of each drive motor 50, 66.

Figure 7:
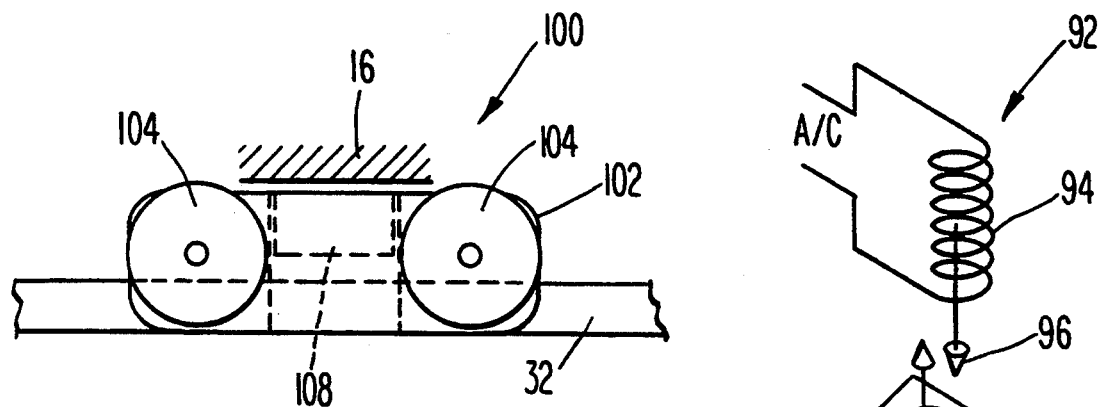
FIG. 7 is a diagrammatical depiction of a cable carriage in the system which is illustrated in FIG. 1.

Referring now to FIG. 7, it will be seen that system 10 includes a cable carriage 100 for isolating carriage 22 from any forces which might otherwise be transmitted to carriage 22 through control cable 32. Such forces include the weight of any suspended portion of cable 32, which might otherwise have a misaligning affect on the carriage 22. As may be seen in FIG. 7, cable carriage 100 includes a frame 102 on which a plurality of wheels 104 are mounted. Frame 102 includes at least one magnet 108, which pulls frame 102 against the stator iron 16 so that wheels 104 are in contact with stator iron 16. As is shown in FIG. 1, carriage 100 preferably rides on the same portion of stator iron 16 that carriage 22 does. As may be seen in FIG. 7, frame 102 is constructed to support cable 32. Cable carriage 100 has no independent drive mechanism, but rather is simply towed behind carriage 22.

It is to be understood, however, that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

We claim:

1. A method for performing a test on an electrical generator of the type having a rotor and a stator, the stator having an inner periphery defining a space within which the rotor is mounted to rotate, the inner periphery comprising a magnetic material in which a plurality of axial stator slots are defined, comprising:

(a) positioning a movable carriage over a selected stator slot so as to be able to axially traverse the selected stator slot, the carriage having testing equipment mounted thereon;
   (b) performing a test with the testing equipment;
   (c) sensing whether the movable carriage is centered in an optimum position with respect to the selected stator slot; and
   (d) centering the movable carriage with respect to the optimum position if the movable carriage is not so centered, whereby accuracy of any testing by the testing equipment is optimized.

2. A method according to claim 1, wherein step (a) comprises using at least one magnet to secure the carriage over the selected slot independently of gravitational forces.

3. A method according to claim 1, wherein step (a) comprises sensing the position of the movable carriage with respect to the magnetic material on at least one side of said selected slot.

4. A method according to claim 3, wherein step (a) further comprises utilizing a first sensor which is constructed and arranged to sense the position of the movable carriage with respect to the magnetic material on one side of the selected slot, and a second sensor which is constructed and arranged to sense the position of the movable carriage with respect to the magnetic material on a second, opposite side of the selected slot.

5. A method according to claim 3, wherein said sensing step is performed with an inductive sensor.

6. A method according to claim 3, wherein said sensing step is performed with a capacitive sensor.

7. A method according to claim 1, wherein step (d) comprises controlling at least one drive wheel on the carriage to center the carriage.

8. A method according to claim 1, wherein step (d) comprises utilizing a first motor for controlling a left side drive wheel on said carriage, and a second motor for controlling a right side drive wheel on said carriage.

* * * * *